(12) United States Patent
Wichtendahl (10) Patent No.: US 12,029,053 B2
(45) Date of Patent: Jul. 2, 2024

(54) OPTOELECTRONIC COMPONENT AND METHOD FOR CONTACTING AN OPTOELECTRONIC COMPONENT

(71) Applicant: HELIATEK GMBH, Dresden (DE)

(72) Inventor: Ralph Wichtendahl, Dresden (DE)

(73) Assignee: HELIATEK GMBH, Dresden (DE)

( * ) Notice: Subject to any disclaimer, the term of this patent is extended or adjusted under 35 U.S.C. 154(b) by 0 days.

(21) Appl. No.: 17/774,481

(22) PCT Filed: Nov. 5, 2020

(86) PCT No.: PCT/DE2020/100950
§ 371 (c)(1),
(2) Date: May 5, 2022

(87) PCT Pub. No.: WO2021/089089
PCT Pub. Date: May 14, 2021

(65) Prior Publication Data
US 2022/0393124 A1 Dec. 8, 2022

(30) Foreign Application Priority Data
Nov. 5, 2019 (DE) ............. 10 2019 129 832.6

(51) Int. Cl.
*H10K 30/83* (2023.01)
*H10K 30/20* (2023.01)
*H10K 30/88* (2023.01)

(52) U.S. Cl.
CPC ............. *H10K 30/83* (2023.02); *H10K 30/88* (2023.02); *H10K 30/20* (2023.02)

(58) Field of Classification Search
CPC ......... H10K 30/83; H10K 30/88; H10K 30/20
See application file for complete search history.

(56) References Cited

U.S. PATENT DOCUMENTS 6,114,046 A * 9/2000 Hanoka ................. H01L 31/048
156/99
8,414,961 B1 * 4/2013 Robinson ............ H01L 31/1884
427/76

(Continued)

FOREIGN PATENT DOCUMENTS

CN 106415874 A 2/2017
CN 110192171 A 8/2019

(Continued)

*Primary Examiner* — Jayne L Mershon
(74) *Attorney, Agent, or Firm* — LEYDIG, VOIT & MAYER, LTD.

(57) ABSTRACT

An optoelectronic component, including: a bottom electrode, a top electrode, a layer system having at least one photoactive layer, the layer system being disposed between the bottom electrode and the top electrode, a planarization layer disposed on a side of the bottom electrode and/or top electrode facing away from the layer system, at least one barrier layer disposed on the planarization layer, and at least one busbar, the at least one busbar being disposed on the at least one barrier layer, wherein: the planarization layer has electrically conductive particles the electrically conductive particles being introduced into the planarization layer, and the electrically conductive particles electrically conductively bridge the planarization layer through the at least one barrier layer such that the bottom electrode and/or the top electrode electrically conductively contacts the at least one busbar.

17 Claims, 2 Drawing Sheets

(56) References Cited

U.S. PATENT DOCUMENTS

| | | |
|---|---|---|
| 2007/0090371 A1 | 4/2007 | Drechsel |
| 2009/0217980 A1 | 9/2009 | Pfeiffer |
| 2012/0118853 A1 | 5/2012 | Ogasawara |
| 2012/0126213 A1 | 5/2012 | Gresser |
| 2012/0260965 A1* | 10/2012 | Hong ................. H01L 31/0512 |
| | | 136/244 |
| 2013/0104968 A1 | 5/2013 | Pfeiffer |
| 2013/0160829 A1 | 6/2013 | Uhrich |
| 2014/0008636 A1 | 1/2014 | Fukuura |
| 2015/0076463 A1 | 3/2015 | Ohazama |
| 2016/0020419 A1 | 1/2016 | Walzer |
| 2016/0141497 A1 | 5/2016 | Weiss |
| 2017/0084859 A1 | 3/2017 | Schwamb |
| 2017/0358763 A1 | 12/2017 | Chung |
| 2018/0090066 A1 | 3/2018 | Furuie |
| 2019/0006599 A1 | 1/2019 | Hildebrandt |
| 2019/0019957 A1 | 1/2019 | Hildebrandt |
| 2021/0098538 A1 | 4/2021 | Kato |

FOREIGN PATENT DOCUMENTS

| | | |
|---|---|---|
| WO | WO 2004083958 A2 | 9/2004 |
| WO | WO 2006092134 A1 | 9/2006 |
| WO | WO 2010133208 A1 | 11/2010 |
| WO | WO 2011013219 A1 | 2/2011 |
| WO | WO 2011138021 A2 | 11/2011 |
| WO | WO 2011161108 A1 | 12/2011 |
| WO | WO 2013001780 A1 | 1/2013 |
| WO | WO 2014128278 A1 | 8/2014 |
| WO | WO 2014206860 A1 | 12/2014 |
| WO | WO 2017114937 A1 | 7/2017 |
| WO | WO 2017114938 A1 | 7/2017 |

* cited by examiner

OPTOELECTRONIC COMPONENT AND METHOD FOR CONTACTING AN OPTOELECTRONIC COMPONENT

CROSS-REFERENCE TO PRIOR APPLICATIONS

This application is a U.S. National Phase application under 35 U.S.C. § 371 of International Application No. PCT/DE2020/100950, filed on Nov. 5, 2020, and claims benefit to German Patent Application No. DE 10 2019 129 832.6, filed on Nov. 5, 2019. The International Application was published in German on May 14, 2021 as WO 2021/089089 A1 under PCT Article 21(2).

FIELD

The invention relates to an optoelectronic component and a method for contacting such an optoelectronic component.

BACKGROUND

Optoelectronics is a combination of the field of optics and semiconductor electronics. In particular, it comprises systems and methods which facilitate the conversion of electronically generated energy into light emission or convert light emissions into energy. Optoelectronic components, in particular organic optoelectronic components, for example organic photovoltaic elements (OPVs) and organic light-emitting diodes (OLEDs), generate electrical energy or convert electrical energy into light emissions, the energy, for application purposes, having to subsequently be guided out of or into the optoelectronic component. Busbars are used to this end. Busbars represent a point in an optoelectronic component where the converted energy is focused and transmitted in the form of electric currents.

By way of example, organic optoelectronic components can be produced by evaporating the materials, by printing polymers or by processing from liquids. The fundamental design of organic optoelectronic components is disclosed in WO2004083958 or in WO2011138021.

Organic optoelectronic components, in particular organic photovoltaic cells, exhibit a significantly reduced service life as a result of direct contact with air, oxygen, water and/or moisture, and must therefore be protected by encapsulation. As a rule, optoelectronic components therefore are provided with a protective layer or are encapsulated for protection against external influences, in particular in order to protect said components mechanically and from environmental influences, for example moisture or diffusion of oxygen. Encapsulation can be formed by barrier films or by direct encapsulation.

Organic optoelectronic components are structured by means of laser processes. In particular, these methods are used both to connect individual photovoltaic cells in an optoelectronic component and to electrically separate photovoltaic cells. Bulges, which are known as laser scribes, may arise as a result of the laser structuring, in particular laser structuring of the electrodes, and these exceed the height of the layers of the flat topology of a layer system of an organic photovoltaic element many times over. Firstly, this makes the application of further layers, in particular a barrier layer, difficult and, secondly, an already applied layer might be damaged during a subsequent encapsulation. Known processes for integrating a thin-film encapsulation are very sensitive in relation to the topology of individual layers of the layer system and lead to height differences within a layer of the layer system. Therefore, most thin-film encapsulations have a planarization layer before a barrier layer is applied.

When integrating the thin-film encapsulation in photovoltaic elements, in particular solar cells, it is necessary to implement contacting by means of busbars. Contacting must also be implemented within the region in which the thin-film encapsulation, that is to say a barrier layer, is located. However, the prior art is disadvantageous in that, in particular, such contacting is very complicated and expensive.

SUMMARY

In an embodiment, the present invention provides an optoelectronic component, comprising: a bottom electrode, a top electrode, a layer system having at least one photoactive layer, the layer system being disposed between the bottom electrode and the top electrode, a planarization layer disposed on a side of the bottom electrode and/or top electrode facing away from the layer system, at least one barrier layer disposed on the planarization layer, and at least one busbar, the at least one busbar being disposed on the at least one barrier layer, wherein: the planarization layer has electrically conductive particles the electrically conductive particles being introduced into the planarization layer, and the electrically conductive particles electrically conductively bridge the planarization layer through the at least one barrier layer such that the bottom electrode and/or the top electrode electrically conductively contacts the at least one busbar.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

In an embodiment, the present invention provides an optoelectronic component and a method for producing such an optoelectronic component, without the disadvantages described in the prior art. The underlying technical problem of the present invention is based, in particular, firstly planarizing laser scribes that have arisen from the laser structuring of the individual layers of an optoelectronic component so that a barrier layer is rendered applicable in order to facilitate sealing or sealing up by means of a thin film and, secondly, providing electrically conductive contacting of a layer of the optoelectronic component, in particular an electrode layer, with a layer disposed above the barrier layer, in particular a busbar. In particular, it should be possible to integrate the method into a roll-to-roll process.

Embodiments of the present invention provide an optoelectronic component, more particularly a photovoltaic element, comprising a bottom electrode, a top electrode and a layer system having at least one photoactive layer, the layer system being disposed between the bottom electrode and the top electrode, a planarization layer disposed on the side of the bottom electrode and/or top electrode facing away from the layer system, at least one barrier layer disposed on the planarization layer, and at least one busbar, the at least one busbar being disposed on the at least one barrier layer. The planarization layer has electrically conductive particles, the electrically conductive particles being at least largely introduced into the planarization layer and the electrically conductive particles electrically conductively bridging the planarization layer through the at least one barrier layer such that the bottom electrode and/or the top electrode are electrically conductively contacted with the at least one busbar. In particular, the optoelectronic component is a photovoltaic element.

In an embodiment of the invention, the bottom electrode, the layer system and/or the top electrode are laser structured. In an embodiment of the invention, the layer system is electrically conductively connected to the bottom electrode and/or the top electrode by means of laser structuring. In an embodiment of the invention, the bottom electrode forms a cathode and the top electrode forms an anode, wherein the bottom electrode and the top electrode are electrically conductively contacting the layer system.

In an embodiment of the invention, the electrically conductive particles are at least largely introduced into the planarization layer, wherein the electrically conductive particles are electrically conductively bridging the planarization layer through the at least one barrier layer. As a result, the top electrode and the busbar of the optoelectronic component in particular are electrically conductively interconnected by means of the planarization layer that has the electrically conductive particles.

A planarization layer is understood to be in particular a layer for evening out unevenness, in particular for reducing roughness, of at least one other layer of the optoelectronic component, in particular a layer of a bottom electrode and/or a layer of a top electrode.

An optoelectronic component is understood to be in particular a component that emits electromagnetic radiation or a component that absorbs electromagnetic radiation. A component that absorbs electromagnetic radiation is preferably an organic photovoltaic element (OPV) or an organic photocell. A component that emits electromagnetic radiation is preferably an OLED (organic light-emitting diode) or a transistor.

A photovoltaic element is understood to be in particular a photovoltaic cell, in particular a solar cell. The photovoltaic element is preferably constructed from a plurality of photovoltaic cells, which may be connected in series or in parallel. The plurality of photovoltaic cells may be disposed and/or connected in different ways in the photovoltaic element.

A busbar is understood to be in particular an arrangement that, for the purposes of electrical contacting, is electrically conductively connected to incoming and outgoing lines as a central distributor of electrical energy, preferably connected to at least one bottom electrode and/or at least one top electrode. In particular, the busbar has a planar embodiment in the form of a band, strip, plate or metal layer.

In an embodiment of the invention, the at least one busbar has a layer thickness of 10 µm to 500 µm, preferably 100 µm to 500 µm, preferably 10 µm to 200 µm, preferably 10 µm to 100 µm, preferably 10 µm to 50 µm, preferably 20 µm to 80 µm, preferably 20 µm to 40 µm, or preferably 30 µm to 50 µm.

In an embodiment of the invention, the at least one busbar is disposed directly on the barrier layer or disposed on the barrier layer by means of an adhesive layer disposed between the barrier layer and the at least one busbar. In an embodiment of the invention, the busbar has an adhesive layer, wherein the busbar being disposed on the at least one barrier layer by means of the adhesive layer. In an embodiment of the invention, the busbar and/or the busbar with an adhesive layer disposed thereon has a layer thickness of 10 µm to 100 µm, preferably 10 µm to 80 µm, preferably 20 µm to 80 µm, preferably 30 µm to 100 µm, preferably 30 µm to 80 µm, or preferably 30 µm to 60 µm.

In an embodiment of the invention, the bottom electrode and/or the top electrode are electrically conductively connected to the adhesive layer and/or the at least one busbar through the at least one barrier layer by means of the electrically conductive particles.

A possible structure of the layer system of a photovoltaic element is described in WO2004083958A2, WO2011013219A1, WO2011138021A2, and WO2011161108A1. In the applications specified here, use is preferably made of layer systems in which the photoactive layers comprise absorber materials which are evaporable and which are or have been applied by vapor deposition. To this end, use is made of materials belonging to the group of "small molecules", which are described, inter alia, in WO2006092134A1, WO2010133208A1, WO2014206860A1, WO2014128278A1, WO2017114937A1, and WO2017114938A1. The photoactive layers form acceptor/donor systems and may be of a plurality of individual layers, or mixed layers, formed as a planar heterojunction and preferably as a bulk heterojunction. Layer systems completely applied by way of vapor deposition are preferred.

The layer system can be in the form of a single cell, tandem cell or multicell, the designation being determined by the number of subcells, with each subcell containing at least one photoactive layer which are preferably separated by transport layers, and optional recombination layers, and which themselves may consist of a plurality of layers. The p-layer systems or n-layer systems, also referred to simply as p-layer or n-layer, may consist of a plurality of layers, with at least one of the layers of the p-layer system or n-layer system being p-doped or n-doped, preferably as a p-doped or n-doped wide gap layer. The i-layer system, also referred to as i-layer, is an undoped or less doped, that is to say has weaker doping, in relation to the p- and n-layers in the subcell, and is formed as photoactive layer. Each of these n-, p-, layers may consist of further layers, with the n- and p-layer consisting of at least one doped n- and p-layer, respectively, which as a result of its doping contributes to an increase in the charge carriers. This means that the layer system of the optoelectronic component consists of an expedient combination of p-, n-, and i-layer systems, that is to say each subcell comprises an i-layer system and at least one p- or n-layer system.

Individual layers of the optoelectronic component are deposited on a substrate for the purposes of producing the optoelectronic component. In this case, a defect-free deposition and/or a defect-free connection of a following layer requires a planarization of a surface of underlying layers, in particular a reduction of unevenness of the surface.

In an embodiment of the invention, the bottom electrode is arranged on a substrate, in particular a film. In an embodiment of the invention, the optoelectronic component has a substrate, the substrate being a carrier in particular. In an embodiment the substrate is a film, preferably a film formed from a plastic, the film in particular being at least partly transparent.

A barrier layer is understood to be, in particular, a protective layer which forms a barrier against chemical contaminants, moisture and/or oxygen. In particular, the barrier layer is a protective layer for preventing the transmission of external influences, in particular oxygen from the air and/or moisture, a protective layer for increasing the mechanical resistance, in particular resistance to scratches, and/or a filter layer, preferably a layer with a UV filter.

In an embodiment, the optoelectronic component has at least one cell with at least one photoactive layer, in particular a CIS-, CIGS-, GaAs-, or Si-cell, a perovskite cell or an organic photovoltaic element (OPV), a so-called organic solar cell. An organic photovoltaic element is understood to mean in particular a photovoltaic element having at least one organic photoactive layer, in particular a polymer organic photovoltaic element or an organic photovoltaic element on the basis of small molecules. While polymers are distinguished by being not evaporable and therefore only being able to be applied from solutions, small molecules are usually evaporable and can either be applied like polymers as a solution, but also by means of vapor deposition technology, in particular by evaporation from a vacuum.

In an embodiment of the invention, the at least one photoactive layer of the layer system comprises small molecules which are evaporable in vacuo. In an embodiment of the invention, at least one photoactive layer of the layer system is vapor deposited in vacuo.

Small molecules are understood to be, in particular, non-polymeric organic molecules having monodisperse molar masses between 100 and 2000 g/mol that exist in the solid phase at standard pressure (air pressure of the ambient atmosphere) and at room temperature. In particular, the small molecules are photoactive, "photoactive" being understood to mean that the molecules undergo a change of charge state and/or of polarization state when light is supplied. Advantages of these absorber materials on the basis of small molecules are an evaporability in vacuo.

In an embodiment of the invention, the at least one busbar is formed as a metal layer made of at least one metal or an alloy thereof, preferably aluminum or an alloy thereof.

In an embodiment of the invention, the at least one barrier layer is at least largely not electrically conductive.

In an embodiment of the invention, the planarization layer is at least largely not electrically conductive.

In an embodiment of the invention, the top electrode is made of silver or a silver alloy, aluminum or an aluminum alloy, gold or a gold alloy, or a combination of these materials, preferably as a silver alloy of Ag:Mg or Ag:Ca.

In an embodiment of the invention, the bottom electrode comprises ITO (indium tin oxide).

In an embodiment of the invention, the photovoltaic element has a layer system with at least two photoactive layers, the photovoltaic element being a tandem cell, preferably with at least three photoactive layers, the photovoltaic element being a triple cell.

In an embodiment of the invention, the layer system additionally comprises at least one charge carrier transport layer, the at least one charge carrier transport layer being disposed between the bottom electrode or the top electrode and a photoactive layer, the layer system preferably comprises at least a first charge carrier transport layer and a second charge carrier transport layer, the first charge carrier transport layer being disposed between the bottom electrode and the at least one photoactive layer and the second charge carrier transport layer being disposed between the at least one photoactive layer and the top electrode.

In an embodiment of the invention, the planarization layer and/or the at least one barrier layer is formed over the entire layer system of the optoelectronic component.

The optoelectronic component according to the invention has advantages over the prior art. Advantageously, a closed planar topology of an electrode layer is obtained. Advantageously, simple and reliable electrically conductive contacting of the optoelectronic component is facilitated, in particular between an electrode and a busbar within the optoelectronic component. Advantageously, the planarization layer is electrically conductively bridged by way of the electrically conductive particles. Advantageously, damage to the layer system and/or the electrodes is avoided within the scope of contacting. Advantageously, no losses or hardly any losses in the electrical conductivity are observed in the case of such electrically conductive contacting. Advantageously, the contacting is facilitated in a cost-effective and simple manner. Advantageously, the service life of optoelectronic components is increased by means of such electrically conductive contacting. Advantageously, the planarization layer with the electrically conductive particles facilitates a reduction in the unevenness of the underlying layer, in particular the surface of the underlying layer, and at the same time facilitates electrically conductive contacting. Advantageously, the electrically conductive particles are able to be integrated particularly easily into the planarization layer. Advantageously, the method is able to be integrated into a roll-to-roll process.

According to a development of the invention, provision is made for the planarization layer to have a layer thickness of 5 µm to 100 µm, preferably from 10 µm to 50 µm, and/or for the at least one barrier layer to have a layer thickness from 100 nm to 2000 nm, preferably from 100 nm to 1000 nm, preferably from 150 nm to 1000 nm, preferably from 200 nm to 800 nm, or preferably from 300 nm to 600 nm.

In an embodiment, the planarization layer has a layer thickness of less than 200 µm, preferably less than 100 µm, preferably less than 70 µm, preferably less than 50 µm, preferably less than 30 µm, preferably from 10 µm to 200 µm, preferably from 10 µm to 100 µm, preferably from 10 µm to 70 µm, preferably from 10 µm to 50 µm, or preferably from 10 µm to 30 µm.

In a further preferred embodiment, the barrier layer has a layer thickness of less than 10 µm, preferably less than 5 µm, preferably less than 3 µm, or preferably less than 1 µm.

According to a development of the invention, provision is made for the electrically conductive particles to have a mean diameter from 1 µm to 100 µm, preferably from 1 µm to 50 µm, and/or for the mean diameter of the electrically conductive particles to be greater than the layer thickness of the planarization layer, preferably up to 100% greater than the layer thickness of the planarization layer, or preferably up to 10% greater.

In conjunction with the present invention, a diameter is understood to mean in particular an equivalent diameter, preferably a geometric equivalent diameter, with in particular this also being understood to mean the diameter of irregularly shaped particles. The geometric equivalent diameter is obtained by determining the diameter of a sphere or a circle with the same geometric property.

In an embodiment of the invention, the electrically conductive particles have a mean diameter from 1 µm to 100 µm, preferably from 1 µm to 70 µm, preferably from 1 µm to 50 µm, or preferably from 1 µm to 30 µm. In an embodiment of the invention, the electrically conductive particles have a mean diameter that is greater than the layer thickness of the planarization layer. In an embodiment of the invention, the electrically conductive particles have a certain size distribution, wherein the certain size distribution of the electrically conductive particles preferably having a low standard deviation as possible.

In an embodiment of the invention, a mean diameter of the electrically conductive particles is greater than the layer thickness of the planarization layer, preferably up to 200% greater than the layer thickness of the planarization layer, preferably up to 150%, preferably up to 100%, preferably up to 80%, preferably up to 60%, preferably up to 50%, preferably up to 40%, preferably up to 30%, preferably up to 20%, preferably up to 10%, preferably up to 5%, preferably up to 2%, or preferably up to 1%, or preferably at least 1% greater than the layer thickness of the planarization layer, preferably at least 2%, preferably at least 5%, preferably at least 10%, preferably at least 20%, preferably at least 30%, or preferably at least 50%.

In an alternatively preferred embodiment of the invention, the mean diameter of the electrically conductive particles is less than the layer thickness of the planarization layer, with a plurality of the electrically conductive particles electrically conductively contacting one another within the planarization layer such that the electrically conducting contact through the planarization layer is ensured.

According to a development of the invention, provision is made for the shape of the electrically conductive particles to be spherical, angular, acicular and/or crystalline, the electrically conductive particles preferably have different shapes, and/or for the electrically conductive particles to be shaped regularly or irregularly, preferably as splinters, crystals or granulate.

In an embodiment of the invention, the electrically conductive particles have a certain surface energy, which is readily wettable with a planarization material.

According to a development of the invention, provision is made for the electrically conductive particles to be formed from conductively coated glass, preferably silver-coated glass, from conductive metal, preferably from nickel or an alloy thereof, or from crystallites.

According to a development of the invention, provision is made for a proportion of the volume of the electrically conductive particles in the planarization layer to be 10 to 50%, preferably 20 to 40%, preferably 10 to 30%, preferably 10 to 20%, preferably 5 to 30%, or preferably 5 to 20%, in each case in relation to the overall volume of the planarization layer, and/or for a proportion of the surface of the electrically conductive particles on a side of the planarization layer facing the barrier layer to be 10 to 50%, preferably 10 to 30%, preferably 10 to 20%, preferably 5 to 50%, preferably 5 to 30%, preferably 5 to 20%, or preferably 5 to 10%, in each case in relation to the surface of the planarization layer, and/or for the electrically conductive particles in the planarization layer to be at least largely arranged in the region of the at least one busbar.

In an embodiment of the invention, the electrically conductive particles in the planarization layer are at least largely disposed in the region of the at least one following busbar. In an embodiment of the invention, the electrically conductive particles in the planarization layer are at least largely disposed under the at least one busbar.

In an embodiment of the invention, the optoelectronic component is a flexible optoelectronic component, preferably a flexible photovoltaic element, particularly preferably a flexible organic photovoltaic element.

According to a development of the invention, provision is made for the optoelectronic component to be an organic photovoltaic element, preferably a flexible organic photovoltaic element, with at least one photoactive layer of the organic photovoltaic element preferably having small molecules as an absorber material.

In particular, a flexible optoelectronic component is understood to mean an optoelectronic component which is bendable and/or stretchable in a certain region.

In an embodiment of the invention, the optoelectronic component is encapsulated by means of at least one further barrier layer, with the at least one busbar being guided out of the at least one further barrier layer. Preferably, the encapsulation is a thin-film encapsulation.

In an embodiment of the invention, the optoelectronic component has an encapsulation of at least one barrier layer which encloses the optoelectronic component in diffusion-tight fashion, that is to say seals the latter. In an embodiment, the encapsulation is a polymer encapsulation.

In an embodiment of the invention, the optoelectronic component comprises at least a first photovoltaic cell and a second photovoltaic cell, the first photovoltaic cell and the second photovoltaic cell being connected in series and, preferably, the top electrode of the first photovoltaic cell being electrically conductively connected to the bottom electrode of the second photovoltaic cell.

Embodiments of the present invention also provide a method for contacting an optoelectronic component, in particular a flexible optoelectronic component, in particular according to any one of the exemplary embodiments described above. For the method for contacting the optoelectronic component, this gives rise in particular to the advantages already described in conjunction with the optoelectronic component. In this case, the method comprises the following steps:
    a) providing a substrate with a bottom electrode disposed thereon, a layer system with at least one photoactive layer, and a top electrode, the layer system being disposed between the bottom electrode and the top electrode,
    b) applying a planarization material on the bottom electrode and/or the top electrode,
    c) introducing electrically conductive particles into and/or onto the planarization material,
    d) curing the planarization material, preferably by way of UV radiation and/or a thermal treatment, a planarization layer with the electrically conductive particles being formed,
    e) applying at least one barrier layer on the planarization layer, with the at least one barrier layer preferably being at least partly penetrated by the electrically conductive particles, and
    f) applying at least one busbar on the at least one barrier layer such that the bottom electrode and/or the top electrode are electrically conductively contacted with the at least one busbar by way of the electrically conductive particles.

In an embodiment of the invention, step b) and step c) are carried out simultaneously, in particular the electrically conductive particles are at least partially already contained within the planarization material.

A planarization material is understood to be in particular a material which, following application to a surface, forms a planarization layer by curing, in particular by crosslinking.

In an embodiment of the invention, the planarization material is applied directly to the layer to be planarized, in particular the bottom electrode and/or the top electrode.

In an embodiment of the invention, the planarization material is a planarizing resist. In an embodiment of the invention, the planarization material is applied in liquid form.

In an embodiment, the electrically conductive particles are introduced into the planarization layer in step c) by means of an inkjet printing method, an offset printing method, a flexography method, an intaglio method, a screen-printing method or a rakel method.

In an embodiment of the invention, the at least one barrier layer is at least partly penetrated by the electrically conductive particles in step e) and/or in step f).

In an embodiment of the invention, the layers are applied by means of a printing method, preferably an inkjet method, a screen-printing method, and/or a flexographic method, and/or by means of vapor deposition of the materials to be applied. These methods are known to a person skilled in the art and are therefore not explained in any more detail here.

According to a development of the invention, provision is made for the planarization material in step b) to be applied by means of a wet coating, and/or for the electrically conductive particles to be introduced into certain regions of the planarization material in step c), preferably in regions of the planarization material with a subsequent application of the at least one busbar in step f).

According to a development of the invention, provision is made for the electrically conductive particles to be introduced into the planarization material by means of pressure in step c), preferably by means of a pressure roller or, in the case of magnetic particles, by means of a magnet arranged under the optoelectronic component to be contacted.

In an embodiment of the invention, the method is used in a roll-to-roll process.

In an embodiment of the invention, the electrically conductive particles are applied to the barrier layer by means of a transfer tape. Following the crosslinking of the planarization layer, the introduced particles have better adherence within the planarization layer than to the transfer tape, and so the transfer tape can be pulled off the planarization layer. Preferably, the transfer tape for applying the electrically conductive particles is at least partly transparent to UV radiation such that the barrier layer can be cured when the transport tape rests thereon.

In an embodiment of the invention, the at least one busbar is imprinted on the barrier layer, a certain topology being formed on the busbar which preferably has a size of 10 to 100% of the layer thickness of the planarization layer, preferably 10 to 70%, preferably 10 to 50%, or preferably 10 to 30%. In an embodiment of the invention, the at least one busbar is placed onto and/or pressed into the planarizing resist following the application of the latter.

Figure 1:
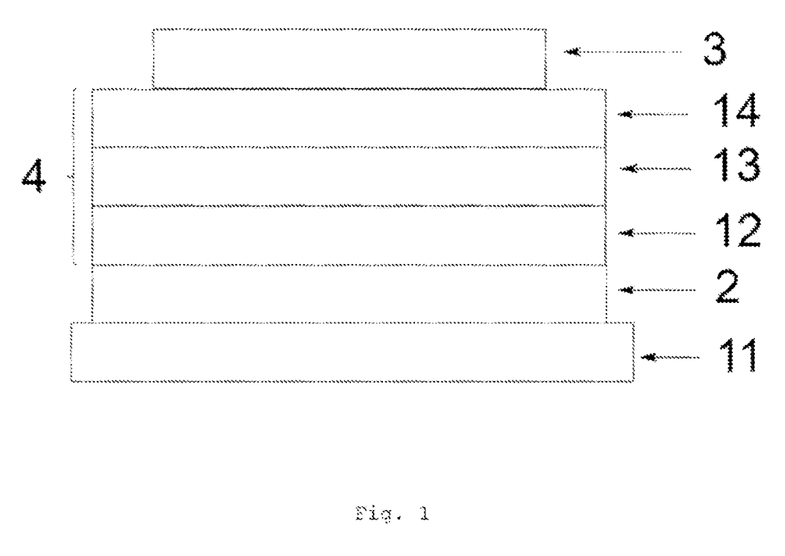
FIG. 1 shows a schematic representation of a structure of a layer system with electrodes of an optoelectronic component.

The invention is elucidated in more detail hereinbelow with reference to the drawings. In the figures:

FIG. 1 shows a schematic representation of a structure of a layer system 4 with electrodes 2, 3 of an optoelectronic component 1.

Optoelectronic components 1, in particular organic photovoltaic elements, consist of a sequence of thin layers with at least one photoactive layer, which is preferably vapor deposited in vacuo or processed from a solution. The electrical link, that is to say contacting, can be implemented by metal layers, transparent conductive oxides and/or transparent conductive polymers. The vacuum vapor deposition of the organic layers is advantageous, in particular, when producing multi-layer solar cells, in particular tandem cells or triple cells. A layer system 4 of such an optoelectronic component 1 is depicted in one exemplary embodiment in FIG. 1.

In this exemplary embodiment, the optoelectronic component 1 has a bottom electrode 2, in particular a transparent bottom electrode made of ITO, disposed on a substrate 11, in particular on a substrate made of glass. Formed thereon is the layer system 4 with an n-layer 12 with fullerene C60 as a charge carrier layer, a photoactive layer 13 with at least one absorber material and fullerene C60, and a p-layer 14 as a hole transport layer made of Di-NPB and NDP9. A top electrode 3, in particular made of gold, is arranged thereon. The layer system 4 and/or the electrodes 2, 3 are usually laser structured. The layer system 4 may contain further hole injection layers, hole transport layers, photoactive layers, electron transport layers and/or electron injection layers.

The topography of a laser-structured optoelectronic component 1 usually has laser scribes which should be planarized for a subsequent layer, in particular a barrier layer 6, in particular planarized by means of a planarization layer 5. The barrier layer 6 can be arranged above the top electrode 3, in particular following a previously applied planarization layer 5. In particular, the barrier layer 6 can be a thin-film encapsulation.

Figure 2:
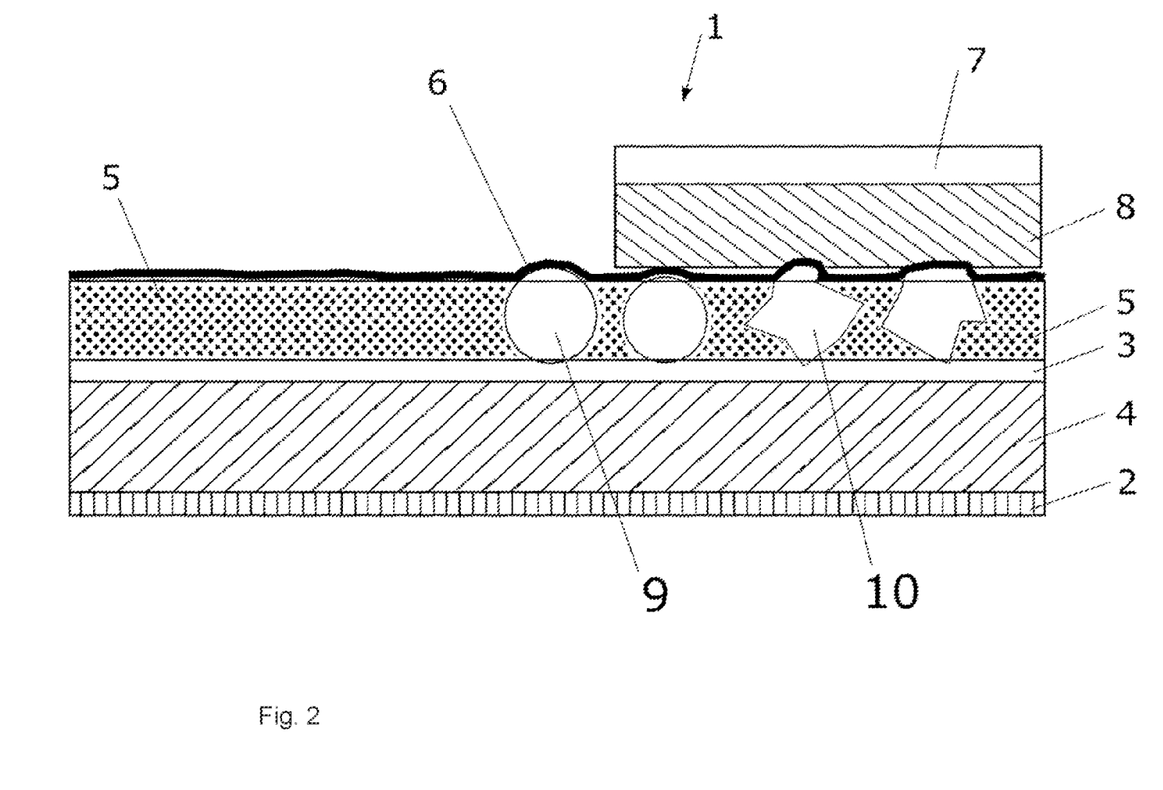
FIG. 2 shows a side view of a schematic representation of an exemplary embodiment of an optoelectronic component with a planarization layer with electrically conductive particles.

FIG. 2 shows a side view of a schematic representation of an exemplary embodiment of an optoelectronic component 1 with a planarization layer 5 with electrically conductive particles 9, 10. Identical and functionally equivalent elements have been provided with the same reference signs, and so reference is made to the description above in this respect. The proportions of the layers of the layer system 4 have not been depicted true to scale.

The optoelectronic component 1, more particularly a photovoltaic element, comprises a bottom electrode 2, a top electrode 3, a layer system 4 having at least one photoactive layer, the layer system 4 being disposed between the bottom electrode 2 and the top electrode 3, a planarization layer 5 disposed on the side of the bottom electrode 2 and/or top electrode 3 facing away from the layer system 4, at least one barrier layer 6 disposed on the planarization layer 5, and at least one busbar 7, the at least one busbar 7 being disposed on the at least one barrier layer 6. The planarization layer 5 has electrically conductive particles 9, 10, the electrically conductive particles 9, 10 being at least largely introduced into the planarization layer 5 and the electrically conductive particles 9, 10 electrically conductively bridging the planarization layer 5 through the at least one barrier layer 6 such that the bottom electrode 2 and/or the top electrode 3 are electrically conductively contacted with the at least one busbar 7.

As a result, simple and reliable electrically conductive contacting of the optoelectronic component 1 is ensured, in particular between an electrode 2, 3 and a busbar 7 within the optoelectronic component 1. As a result, the planarization layer 5, in particular, is electrically conductively bridged by way of the electrically conductive particles 9, 10. No losses or hardly any losses in the electrical conductivity are observed in the case of such electrically conductive contacting. The electrically conductive particles 9, 10 are able to be integrated into the planarization layer 5 particularly easily.

In one embodiment of the invention, the planarization layer 5 has a layer thickness from 5 µm to 100 µm, preferably from 10 µm to 50 µm, and/or the at least one barrier layer 6 has a layer thickness from 100 nm to 2000 nm, or preferably from 200 nm to 800 nm.

In a further embodiment of the invention, the electrically conductive particles 9, 10 have a mean diameter from 1 µm to 100 µm, preferably from 1 µm to 50 µm, and/or the mean diameter of the electrically conductive particles 9, 10 is greater than the layer thickness of the planarization layer 5, preferably up to 100% greater than the layer thickness of the planarization layer 5, or preferably up to 10% greater.

In a further embodiment of the invention, the shape of the electrically conductive particles 9, 10 is spherical, angular, acicular and/or crystalline, the electrically conductive particles 9, 10 preferably have different shapes, and/or the electrically conductive particles 9, 10 are shaped regularly or irregularly, preferably as splinters, crystals or granulate.

In a further embodiment of the invention, the electrically conductive particles 9, 10 are formed from conductively coated glass, preferably silver-coated glass, from conductive metal, preferably from nickel or an alloy thereof, or from crystallites.

In a further embodiment of the invention, a proportion of the volume of the electrically conductive particles 9, 10 in the planarization layer 5 is 10 to 30%, in relation to the overall volume of the planarization layer 5, and/or a proportion of the surface of the electrically conductive particles 9, 10 on a side of the planarization layer 5 facing the barrier layer 6 is 10 to 50%, preferably 10 to 30%, in relation to the surface of the planarization layer 5, and/or the electrically conductive particles 9, 10 in the planarization layer 5 are at least largely disposed in the region of the at least one busbar 7.

In a further embodiment of the invention, the optoelectronic component 1 is an organic photovoltaic element, preferably a flexible organic photovoltaic element, with at least one photoactive layer of the organic photovoltaic element preferably having small molecules as an absorber material.

The method for contacting the optoelectronic component 1, in particular a flexible optoelectronic component 1, comprises the following steps:
a) providing a substrate with a bottom electrode 2 disposed thereon, a layer system 4 with at least one photoactive layer, and a top electrode 3, the layer system 4 being disposed between the bottom electrode 2 and the top electrode 3,
b) applying a planarization material on the bottom electrode 2 and/or the top electrode 3,
c) introducing electrically conductive particles 9, 10 into and/or onto the planarization material,
d) curing the planarization material, preferably by way of UV radiation and/or a thermal treatment, a planarization layer 5 with the electrically conductive particles 9, 10 being formed,
e) applying at least one barrier layer 6 on the planarization layer 5, with the at least one barrier layer 6 preferably being at least partly penetrated by the electrically conductive particles 9, 10, and
f) applying at least one busbar 7 on the at least one barrier layer 6 such that the bottom electrode 2 and/or the top electrode 3 are electrically conductively contacted with the at least one busbar 7.

In a further embodiment of the invention, the planarization material in step b) is applied by means of a wet coating, and/or the electrically conductive particles 9, 10 are introduced into certain regions of the planarization material in step c), preferably in regions of the planarization material with a subsequent application of the at least one busbar 7 in step f).

In a further embodiment of the invention, the electrically conductive particles 9, 10 are introduced into the planarization material by means of pressure in step c), preferably by means of a pressure roller or, in the case of magnetic particles, by means of a magnet arranged under the optoelectronic component 1 to be contacted.

The at least one barrier layer 6 is penetrated for contacting purposes, that is to say the barrier layer 6 is opened at the location of the electrically conductive particles 9, 10, before and/or during the application of the at least one busbar 7 on the barrier layer 6. The barrier layer 6 itself is not electrically conductive or at least poorly electrically conductive, and covers the electrically conductive particles 9, 10 protruding from the planarization layer 5.

In particular, the method is able to be integrated into a roll-to-roll process.

In a further embodiment of the invention, the layer system 4 comprises at least two photoactive layers, the photovoltaic cell being a tandem cell, preferably at least three photoactive layers, the photovoltaic cell being a triple cell, and/or the layer system 4 additionally comprises at least one charge carrier transport layer, the at least one charge carrier transport layer being disposed between the bottom electrode 2 or the top electrode 3 and a photoactive layer, preferably comprises at least a first charge carrier transport layer and a second charge carrier transport layer, the first charge carrier transport layer being disposed between the bottom electrode 2 and the at least one photoactive layer and the second charge carrier transport layer being disposed between the at least one photoactive layer and the top electrode 3.

The schematic layer sequence of a contacting structure of an optoelectronic component 1 is formed as follows in one exemplary embodiment (FIG. 2): A top electrode 3 is situated on the layer system 4, which is disposed on the bottom electrode 2. The planarization layer 5 comprising electrically conductive particles 9, 10 is disposed on the top electrode 3, the planarization layer 5 having a layer thickness of 50 µm and a mean diameter of the electrically conductive particles 9, 10 being greater than the layer thickness of the planarization layer 5, greater than 50 µm in this exemplary embodiment. The electrically conductive particles 9, 10 can have a regular shape 9 or an irregular shape 10. By way of example, the electrically conductive particles 9, 10 are formed from glass particles coated with conductive silver or formed from conductive metal particles, in particular nickel or an alloy thereof. The barrier layer 6, which has a layer thickness of less than 1 µm, is disposed on the planarization layer 5 with the electrically conductive particles 9, 10. The barrier layer 6 is deposited over the planarization layer 5 having the embedded electrically conductive particles 9, 10. In the present exemplary embodiment, the barrier layer 6 has a layer thickness of less than 1 µm. The barrier layer 6 is at least partly penetrated by the electrically conductive particles 9, 10 such that an electrically conductive connection is formed through the barrier layer 6. A busbar 7 and an adhesive layer 8 disposed thereon are disposed on the barrier layer 6. The electrically conductive contacting between the top electrode 3 and the at least one busbar 7 is therefore formed by means of the electrically conductive particles 9, 10 in particular. In the present exemplary embodiment, the busbar 7 with the adhesive layer 8 disposed thereon has a layer thickness of 35 µm.

In one embodiment, the substrate 11 with the bottom electrode 2, the layer system 4 disposed on the bottom electrode 2, and the top electrode 3, provided in step a), can be obtained as follows: Following the provision of the substrate 11, the bottom electrode 2 of the photovoltaic element is applied thereon and structured. The layer system 4 is subsequently applied to the bottom electrode 2. The layer system 4 can be applied as a single cell, tandem cell or multi-cell, preferably by evaporating small molecules. The layer system 4 is subsequently structured, which is followed by the application of the top electrode 3 and the final structuring. The application of the layers to a region of the bottom electrode 2 for the purposes of forming the layer system 4 can be implemented at least in part by way of a printing process, preferably by an inkjet, screen printing, gravure printing or flexographic process, or by the vapor deposition of the materials to be applied. By way of example, the individual layers can be structured by means of laser ablation, electron or ion beam ablation, or shadow masks.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An optoelectronic component, comprising:
a bottom electrode;
a top electrode;
a layer system having at least one photoactive layer, the layer system being disposed between the bottom electrode and the top electrode;
a planarization layer disposed on a side of the bottom electrode and/or top electrode facing away from the layer system;
at least one barrier layer disposed on the planarization layer, wherein the at least one barrier layer is formed over an entirety of the layer system; and
at least one busbar, the at least one busbar being disposed on the at least one barrier layer, wherein:
the planarization layer has electrically conductive particles the electrically conductive particles being introduced into the planarization layer, and
the electrically conductive particles electrically conductively bridge the planarization layer through the at least one barrier layer such that the bottom electrode and/or the top electrode electrically conductively contacts the at least one busbar.

2. The optoelectronic component according to claim 1, wherein the planarization layer has a layer thickness from 5 µm to 100 µm and/or the at least one barrier layer has a layer thickness from 100 nm to 2000 nm.

3. The optoelectronic component according to claim 1, wherein the electrically conductive particles have a mean diameter from 1 µm to 100 µm and/or the mean diameter of the electrically conductive particles is greater than the layer thickness of the planarization layer.

4. The optoelectronic component according to claim 1, wherein the shape of the electrically conductive particles is spherical, angular, acicular and/or crystalline, the electrically conductive particles having varying shapes.

5. The optoelectronic component according to claim 1, wherein the electrically conductive particles are formed from conductively coated glass.

6. The optoelectronic component according to claim 1, wherein a proportion of the volume of the electrically conductive particles in the planarization layer is 10 to 30%, in relation to the overall volume of the planarization layer, and/or a proportion of the surface of the electrically conductive particles on a side of the planarization layer facing the barrier layer is 10 to 50% in relation to the surface of the planarization layer, and/or the electrically conductive particles in the planarization layer are at least largely disposed in a region including the at least one busbar.

7. The optoelectronic component according to claim 1, wherein the optoelectronic component is an organic photovoltaic element with at least one photoactive layer of the organic photovoltaic element having small molecules as an absorber material.

8. A method for producing the optoelectronic component according to claim 1, comprising:
a) providing a substrate with a bottom electrode disposed thereon, a layer system with at least one photoactive layer, and a top electrode, the layer system being disposed between the bottom electrode and the top electrode;
b) applying a planarization material on the bottom electrode and/or the top electrode;
c) introducing electrically conductive particles into and/or onto the planarization material;
d) curing the planarization material, by way of UV radiation and/or a thermal treatment, a planarization layer with the electrically conductive particles being formed;
e) applying at least one barrier layer on the planarization layer, with the at least one barrier layer being at least partly penetrated by the electrically conductive particles; and
f) applying at least one busbar on the at least one barrier layer such that the bottom electrode and/or the top electrode electrically conductively contacts the at least one busbar by way of the electrically conductive particles.

9. The method for producing an optoelectronic component according to claim 8, wherein the planarization material in step b) is applied by a wet coating, and/or the electrically conductive particles are introduced into regions of the planarization material with a subsequent application of the at least one busbar in step f).

10. The method for producing an optoelectronic component according to claim 8, wherein the electrically conductive particles are introduced into the planarization material in step c) by a pressure roller or, in the case of magnetic particles, by a magnet arranged under the optoelectronic component to be contacted.

11. The optoelectronic component according to claim 1, wherein the planarization layer has a layer thickness from 10 vim to 50 μm and/or the at least one barrier layer has a layer thickness from 200 nm to 800 nm.

12. The optoelectronic component according to claim 1, wherein the electrically conductive particles have a mean diameter from 1 μm to 50 μm and/or the mean diameter of the electrically conductive particles is up to 100% greater than the layer thickness of the planarization layer.

13. The optoelectronic component according to claim 1, wherein the electrically conductive particles are shaped regularly as splinters, crystals or granulate.

14. The optoelectronic component according to claim 1, wherein the electrically conductive particles are formed from silver-coated glass, conductive metal, nickel or an alloy thereof, or crystallites.

15. The optoelectronic component according to claim 1, wherein the optoelectronic component comprises a photovoltaic element.

16. The optoelectronic component according to claim 1, wherein the at least one barrier layer is at least partly penetrated by some of the electrically conductive particles.

17. The optoelectronic component according to claim 1, wherein the planarization layer comprises a crosslinking material configured to reduce height differences between components on one side of the planarization layer as compared to an opposing side of the planarization layer.

* * * * *